United States Patent [19]
Sato et al.

[11] Patent Number: 5,309,105
[45] Date of Patent: May 3, 1994

[54] VIBRATION REDUCTION SYSTEM FOR MAGNETIC-RESONANCE IMAGING APPARATUS

[75] Inventors: Taichi Sato, Ishioka; Yoshiharu Mohri, Chiyoda; Kihachiro Tanaka, Ushiku; Takao Hommei, Katsuta; Masayuki Otsuka, Katsuta; Masashi Wada, Katsuta, all of Japan

[73] Assignee: Hitachi, Ltd., Tokyo, Japan

[21] Appl. No.: 910,543

[22] Filed: Jul. 8, 1992

[30] Foreign Application Priority Data

Jul. 10, 1991 [JP] Japan ................... 3-169617

[51] Int. Cl.[5] .......................... G01R 33/20
[52] U.S. Cl. ...................... 324/318; 324/300
[58] Field of Search ............ 324/300, 318, 320, 322; 335/216, 90; 336/100

[56] References Cited

U.S. PATENT DOCUMENTS

| | | | |
|---|---|---|---|
| 3,760,315 | 9/1973 | Hartmann | 336/100 |
| 3,877,511 | 4/1975 | Brandl | 165/1 |
| 4,509,301 | 5/1985 | Head | 273/410 |
| 4,639,672 | 1/1987 | Beaumont | 324/318 |
| 4,652,824 | 3/1987 | Oppelt | 324/318 |
| 4,871,004 | 10/1989 | Brown et al. | 152/527 |
| 5,084,676 | 1/1992 | Saho | 324/322 |
| 5,134,022 | 7/1992 | Kansupada et al. | 428/215 |

FOREIGN PATENT DOCUMENTS

| | | |
|---|---|---|
| 304127 | 2/1981 | European Pat. Off. . |
| 152588 | 8/1985 | European Pat. Off. . |
| 350640 | 1/1990 | European Pat. Off. . |
| 59-216045 | 5/1985 | Japan . |
| 8607459 | 12/1986 | PCT Int'l Appl. . |
| 2170957 | 8/1986 | United Kingdom . |

*Primary Examiner*—Michael J. Tokar
*Assistant Examiner*—Raymond Y. Mah
*Attorney, Agent, or Firm*—Antonelli, Terry, Stout & Kraus

[57] ABSTRACT

A magnetic-resonance imaging apparatus has superconducting magnets for generating a large uniform magnetic field within a predetermined volume. Within that volume, coils for generating magnetic field gradients are supported on a bobbin, enabling an object within the bobbin to be investigated. The coils on the bobbin are subject to forces but are rigidly connected to the bobbin. Therefore, energy is transmitted to the bobbin which can cause the bobbin to vibrate and so generate noise. To dissipate that energy, the coils are attached to tubes, or other hollow members, on the bobbin, which tubes or hollow members contain movable bodies such as particulate material. The energy due to the forces on the coils cause the movable bodies to move and collide, so dissipating the energy and reducing the noise.

17 Claims, 5 Drawing Sheets

VIBRATION REDUCTION SYSTEM FOR MAGNETIC-RESONANCE IMAGING APPARATUS

BACKGROUND OF THE INVENTION

1. Field of the Invention

The present invention relates to a magnetic-resonance imaging apparatus.

2. Summary of the Prior Art

In a magnetic-resonance imaging apparatus, a strong uniform magnetic field is generated in a predetermined volume, and then a magnetic field gradient is generated within that volume to induce magnetic resonance in an object to be investigated. The resonance is then analyzed to determine the properties of the object. Such a magnetic-resonance imaging apparatus finds particular applicability for medical purposes as it represents a non-invasive method for investigating the interior of a human body.

In order to generate the magnetic field gradients, appropriate coils are supported within the volume in which the strong uniform magnetic field is created, and it is normal to support those coils by a support known as a bobbin, which is in the form of a hollow cylinder, so that the coils may be secured to the inner or outer cylindrical surface thereof. The bobbin is usually made of epoxy resin having a very high elastic modulus. Examples of such magnetic-resonance imaging apparatuses are disclosed in, for example, JP-A-62-261105, JP-A-62-229906, JP-A-62-239503 and JP-A-63-158047.

In order to generate suitable magnetic gradients for magnetic resonance imaging, current pulses are applied to the coils supported on the bobbin. Hence those coils are current carriers in the uniform magnetic field, and forces are generated on the coils, the directions of which forces are determined by Fleming's left hand rule. Thus, one part of each of the coils will experience a force in one direction and another part will experience force in the opposite direction. Therefore, a pulsating load is applied to the bobbin. When the uniform magnetic field is large, the forces can set up oscillations of the bobbin and so generate noise. For medical magnetic resonance imaging, part of the human body to be investigated must be located within the bobbin and, the noise can produce discomfort.

Therefore, JP-A-61-279238 proposed that a rubber pad be interposed between the bobbin and each coil which generated the magnetic field gradient. When the current in a coil generated forces, the coil could move relative to the bobbin, due to deformation of the pad and the vibrations thus generated were damped by the rubber pad.

SUMMARY OF THE PRESENT INVENTION

While the provision of a rubber pad, as disclosed in JP-A-61-279238 reduces noise generated by vibration of the bobbin, it has the significant disadvantage that the coil or coils could then move relative to the bobbin. Hence, the accuracy of control of the magnetic field gradient generated by those coils were significantly impaired. For accurate magnetic resonance, the magnetic field gradient must be positioned accurately and the distribution thereby should not change, since such change causes distortion of the image produced by the magnetic resonance. Therefore, for accuracy, a rigid interconnection of coil and bobbin is desirable.

The present invention therefore proposes that the support for the coils, e.g. the bobbin, includes a hollow part (hollow enclosure), within which hollow part are movable bodies. The movable bodies are preferably granules or other particulate material.

When forces are generated on the coils which tend to induce vibration, the present invention provides rigid interconnection of the coils and support to prevent the coils vibrating relative to the support. Hence, the accuracy of positioning of the magnetic field gradients is not impaired. Instead, the vibrational energy is transmitted to the moving bodies which then move within their hollow enclosure, thereby dissipating the vibrational energy. Thus, the present invention is based on the dissipation of vibrational energy by moving bodies within a hollow enclosure, thereby permitting rigid interconnection of the coils and support.

Normally, the part of the support containing the movable bodies is the part to which the coils are attached to the support, since this ensures that the maximum amount of vibrational energy is transmitted to the moving bodies. However, it is possible for the support to have some or all the bodies within parts which are not directly attached to the coils. Even in this case, the movable bodies will dissipate vibrational energy.

For example, where the support is a cylindrical bobbin, a plurality of hollow tubes may be provided on a cylindrical surface of that bobbin, with there being a sufficient number of tubes wholly to cover the cylindrical surface. The hollow tubes contain movable bodies, e.g. particulate material. Then, the coils for generating magnetic field gradients are attached to some (not necessarily all) of the tubes. The tubes to which the coils are attached then receive directly vibrational energy from the coils, when current pulses are passed through those coils, but the other tubes, not attached to the coils, will also receive vibrational energy transmitted via the bobbin itself, or possibly via adjacent tubes. Hence, vibrational energy can be dissipated efficiently by the movable bodies in the tubes.

It is also possible that the hollow part of the support containing the movable bodies is formed by a plurality of discrete members to which parts of the coils are attached. It is also possible that the bobbin itself is at least partially hollow, and contains movable bodies, or even for the movable bodies to be contained in a part of the support not directly attached to the coils. In these latter cases, however, the noise dissipation effect is reduced.

Preferably, the movable bodies are formed by particulate material e.g. granules. In this case, however, there is the possibility that the granules themselves will generate noise as they move within the hollow part of the support and therefore it may be desirable to include a liquid, such as water or oil, within the hollow part of the support which contains the movable bodies. When the movable bodies are formed by particulate material, it is desirable that such material be of particles of different sizes.

It has been found that the noise dissipation effect achieved by the use of moveable bodies within the support increases with an increase in mass of the movable bodies. Therefore, the number of movable bodies, and the density thereof, should be as high as possible. Of course, if the hollow interior of the support is wholly packed with the bodies, then they will not be able to move and the noise dissipation effect will be reduced. However, it has been found that the noise dissipation effect reaches a maximum when the volume of the bodies represents about 90% of the volume of the hollow interior of the support. To maximize the mass, the use of dense materials such as lead (Pb) is preferable, although $Al_2O_3$ and Zirconia may be used.

BRIEF DESCRIPTION OF THE DRAWINGS

Embodiments of the present invention will now be described in detail, by way of example, with reference to the accompanying drawings, in which.

DETAILED DESCRIPTION

Figure 1:
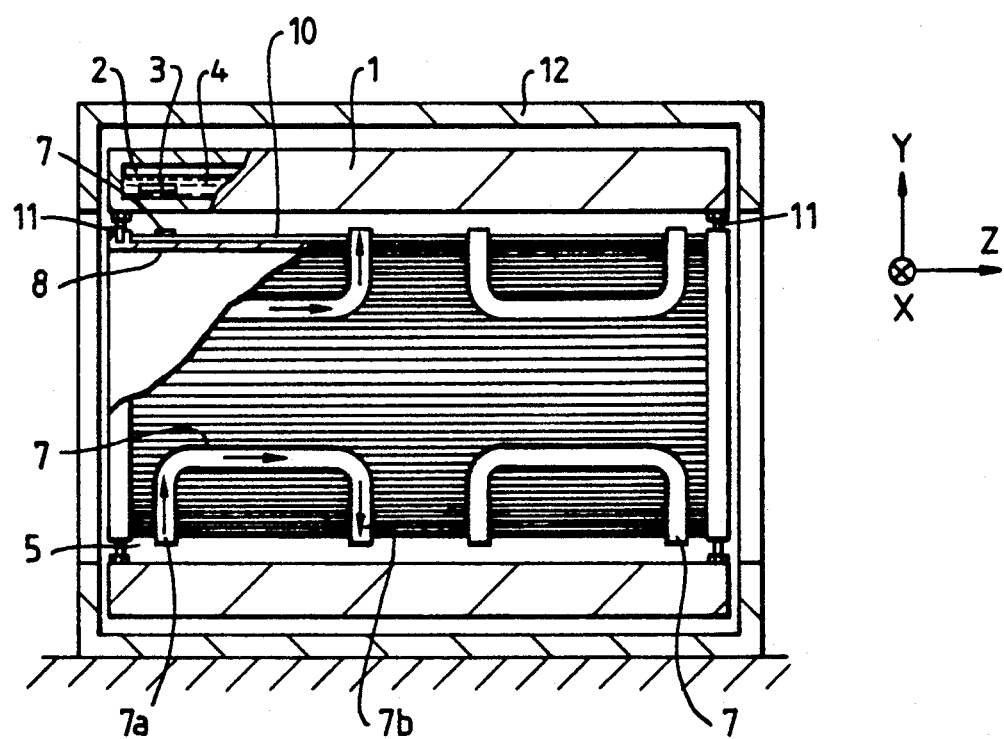
FIG. 1 shows, partially in section, a magnetic-resonance imaging apparatus being a first embodiment of the present invention.

FIG. 1 shows the general structure of a magnetic-resonance imaging apparatus being a first embodiment of the present invention. In FIG. 1, the outer casing is shown in sectional view so that the internal structure of the apparatus can be seen. Furthermore, part of that internal structure is itself shown in sectional view.

In the magnetic-resonance imaging apparatus of FIG. 1, a cryostat 1, which is vacuum insulated, contains a bath of liquid helium 2. Superconducting magnets 3 are located within that liquid helium, and generate a static uniform magnetic field. The liquid helium cools the superconducting magnets 3. The superconducting magnets 3 are such as to generate a constant magnetic field of e.g. 0.5 to 4 Tesla within a space 5 defined by the hollow interior of the cryostat 1. That magnetic field is in the axial direction (i.e. the Z direction in FIG. 1).

Further coils are located within the space 5. These coils generate magnetic field gradients. In FIG. 1, coils 7 are illustrated which generate gradients in the Y-direction. However, in addition to those coils 7, there will also be coils for generating magnetic field gradients in the X and Z directions, but these coils are not illustrated to simplify FIG. 1.

The coils 7 are mounted on a bobbin 8, which bobbin 8 is in the form of a hollow cylinder. In the embodiment of FIG. 1, tubes 10 are mounted on the outer cylindrical surface of the bobbin 8, and the coils 7 are then mounted on the tubes 10. Suitable securing means (not shown), such as a band or bands, secures together the bobbin 8 and the tubes 10, and a similar band or bands (again, not shown) secures together the coils 7 and the bobbin 8, via the tubes 10.

Both ends of the bobbin 8 are connected to the inside of the cryostat 1 by securing bolts 11, thereby aligning the axis of the coils 7 relative to the direction of the magnet field generated by the superconducting magnets 3. A suitable outer shield 12 of e.g. iron is provided around the cryostat 1, to reduce magnetic field leakage.

It can be seen from FIG. 1 that the coils 7 are in the form of a loop and are curved around the outer surface of the bobbin 8. Hence, they have a saddle-like shape. In order to generate a magnetic field gradient, a current pulse i is applied to the coils 7. Considering the lower left coil in FIG. 1, and remembering that the superconducting magnets 3 generate a constant magnetic field in the z direction within the cryostat 1, it can be seen from Fleming's left hand rule that a force will be generated on the left hand branch 7a of the lower left coil 7, which force is axially inward. In a similar way, the force generated on the right hand branch 7b will be axially outward. If the coil 7 was not attached to the bobbin 8 via the tubes 10, it could deform, which would result in distortion of the magnetic field gradient, thereby reducing the accuracy of image generation.

However, because the tubes 10 have a high rigidity, the deformation of the coils 7 is sufficiently small that the distortion of the magnetic field gradient is insignificant. As a result, high-quality images can be obtained.

However, particularly when the static magnetic field is large, large forces are applied to the bobbin 8, causing the bobbin to vibrate and thereby generating noise. This is undesirable, and therefore the tubes 10 are hollow and contain particulate material, e.g. granules 6. The granules 6 are movable within the tubular members 8, and thereby absorb vibrational energy.

Figure 2:
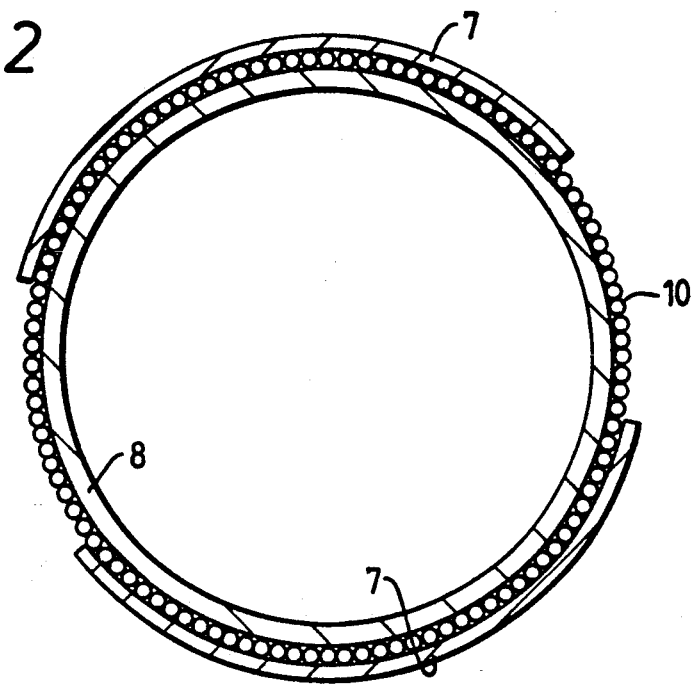
FIG. 2 shows a sectional view of part of the apparatus of FIG. 1.

In the sectional view of FIG. 2, it can be seen that the outer cylindrical surface of the bobbin 8 is entirely covered by tubes 10, although only a more limited number of the tubes 10 lie between the bobbin 8 and the coils 7, and so receive vibrational energy directly from the coils 7. Despite this, some vibrational energy will be transmitted to those tubes 10 who are not directly between the bobbin 8 and the coils 7, thereby improving the noise reducing effect achievable with the present invention.

Figure 3:
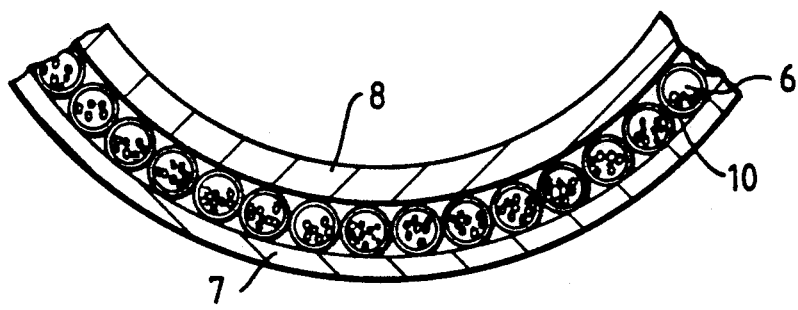
FIG. 3 shows, in detail, part of the section of FIG. 2.

The more detailed sectional view of FIG. 3 shows that the tubular members 10 are partially filled with granules 6 and when vibrational energy is transmitted between the coils 7 and the bobbin 8, the granules 6 move, causing collisions therebetween, and thereby dissipating vibrational energy. Thus, the granules 6 decrease the vibrational energy transmitted from the coils 7 to the bobbin 8. Hence, vibration of the bobbin 8 is reduced and noise generated by the magnetic resonance imaging apparatus is reduced.

It has been found that the noise-reducing effect of the embodiments of FIGS. 1 to 3 increases with increasing mass of the granules 6 within the tubes 10. Therefore, it is preferable for the granules 6 to be of a material of high density, such as lead (Pb). However, $Al_2O_3$ or Zirconium may also be used. Furthermore, the noise-reducing effect increases with increasing volume of granules, up to about 90% of the volume of the interior of the tubes 10. Above about 90%, the noise-reducing effect decreases because the freedom of movement of the granules 6 becomes limited. If the granules were packed sufficiently densely within the tubes 10 that they could not move, the noise reducing effect will be lost.

Figure 4:
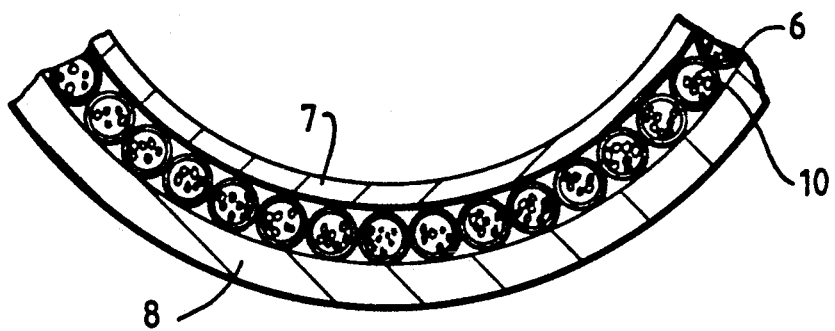
FIG. 4 is similar to FIG. 3, but illustrates a modification of the embodiments of FIGS. 1 to 3.

In the embodiments of FIGS. 1 to 3, the coils are mounted, via the tubes 10, on the outer cylindrical surface of the bobbin 8. However, it is also possible for the coils 7 to be mounted on the inner cylindrical surface, as shown in FIG. 4. Again, tubes 10 containing granules 6 are interposed between the coils 7 and bobbin 8.

Figure 5:
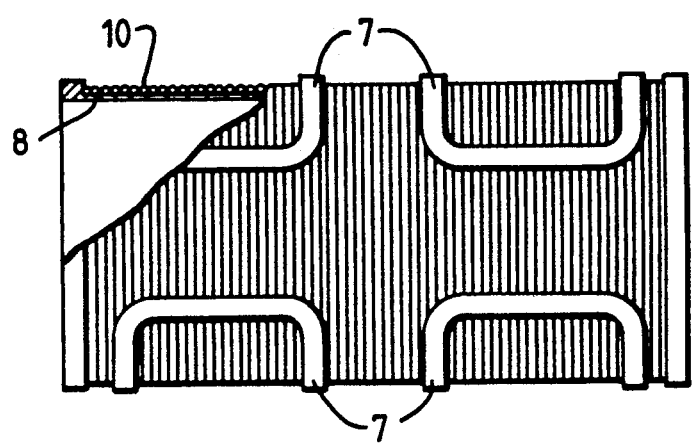
FIG. 5 shows part of a magnetic-resonance imaging apparatus being a second embodiment of the present invention.
Figure 6:
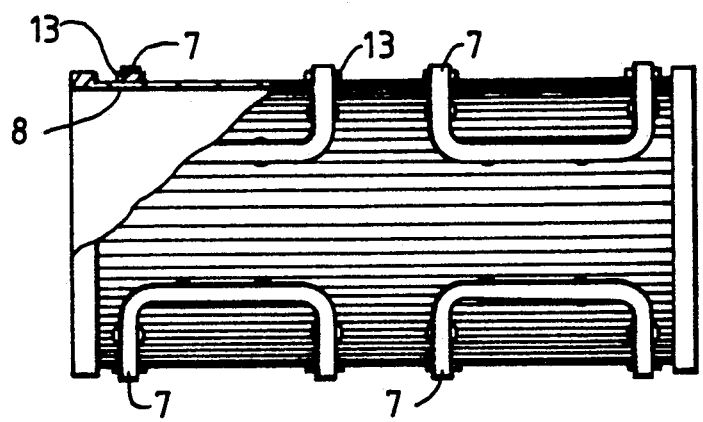
FIG. 6 shows part of a magnetic-resonance imaging apparatus being a third embodiment of the present invention.
Figure 7:
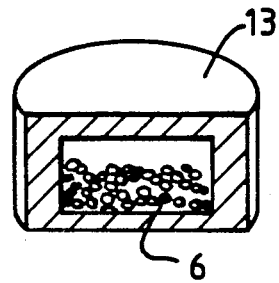
FIG. 7 shows a mounting member used in the embodiment of FIG. 6.

Furthermore, in the embodiments of FIGS. 1 to 4, the tubes 10 extend axially of the bobbin 8. FIG. 5 shows an embodiment in which the tubes 10 extend circumferentially around the bobbin. Again, the tubes 10 may be on the outer cylindrical surface of the bobbin 8, as in FIG. 5, or on the inner cylindrical surface (not shown). In the embodiments of FIGS. 1 to 5, the coils 7 are attached to the bobbin 8 via tubes 10. FIG. 6 shows another embodiment, in which the coils 7 are attached to the bobbin 8 via mounting members 13. These mounting members 13 are discrete hollow members and, as shown in FIG. 7, contains granules 6 in a similar way to the tubes 10 of the embodiments FIGS. 1 to 5. The mounting members 13 form a rigid interconnection between the coils 7 and bobbin 8, thereby preventing distortion of the magnetic field gradients generated by the coils 7. Again, movement of the granules 6 gives a noise-reducing effect. However, since the volume of the granules 6 is more limited in the embodiment of FIGS. 6 and 7, as compared with the embodiments of FIGS. 1 to 5, the noise-reducing effect is less pronounced.

Figure 8:
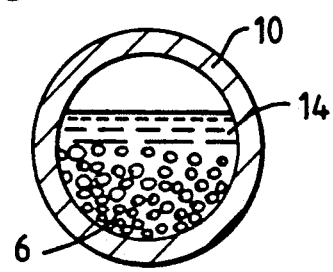
FIGS. 8–11 show structures for enclosing particulate material, which may be used in the embodiments of the present invention.

Since the granules are able to move within the tubes 10 or mounting members 13, they will inevitably collide and noise may be generated by such collisions. To reduce the effect of such noise, the tubes 10 (or mounting members 13) may be partially filled with liquid 14 as shown in FIG. 8.

Figure 9:
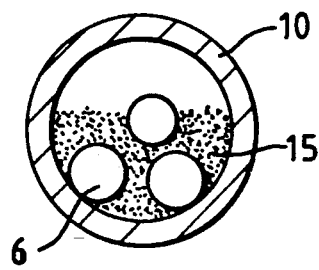

Furthermore, although the previous embodiments have used granules within the tubes 10 or mounting members 13, other movable bodies may be used. FIG. 9 shows an embodiment in which there is powder material 15 within the tubes 10, in addition to the granules 6. The use of such powder material 15 reduces the noise due to collision between granules, and also prevents the granules 6 from blocking together within the tubes 10. It is also possible to use non-granular bodies such as e.g. rods within the tubes 10 or mounting members 13, although this is not preferred as such rods have more limited movement, and so give a smaller noise-reduction effect.

Figure 10:
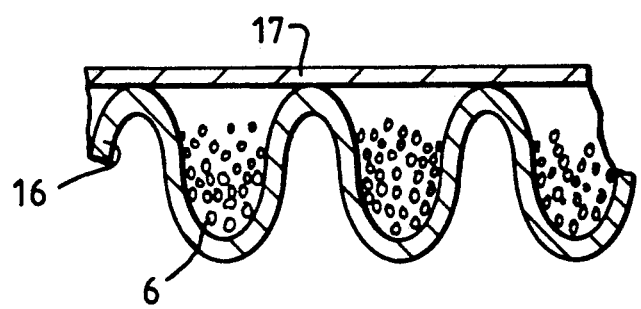
Figure 11:
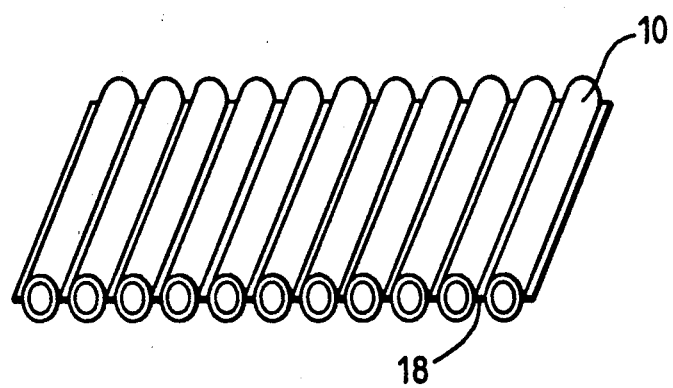

When tubes 10 are used, they are preferably cylindrical but may be square or, indeed, any other shape. For example, FIG. 10 shows an arrangement in which a corrugated sheet 16 with a covering 17 encloses the granules 6. The arrangement of FIG. 10 may then replace the tubular members 10 in any of the embodiments of FIGS. 1 to 5. Where tubes are used, the tubes 10 may be discrete but are preferably interconnected by connections 18 as shown in FIG. 11, so that vibrational energy may be transmitted between the tubes 10.

With the present invention, it is possible to obtain high-quality images free from distortion of the magnetic fields due to movement of the coils which generate the magnet field gradient, despite the force generated when current pulses are applied to those coils, since the coils are rigidly connected to the bobbin or other support. However, the use of support with a hollow part containing moveable bodies, such as granules, reduces noises generated by the apparatus.

What is claimed is:

1. A magnetic-resonance imaging apparatus comprising:
   generation means for generating a magnetic field gradient in a predetermined volume of said magnetic-resonance imaging apparatus;
   a support member for supporting said generation means in a predetermined portion, said support member including a rigid connection member forming a rigid connection attached to said generation means, said rigid connection member including at least one hollow portion therein; and
   particulate material disposed within at least one hollow portion of said rigid connection member so as to be movable within said hollow portion.

2. An apparatus according to claim 1 wherein said rigid connection member comprises at least one hollow tube.

3. An apparatus according to claim 1 wherein said rigid connection member comprises a plurality of hollow tubes.

4. An apparatus according to claim 1, wherein said rigid connection member comprises a plurality of discrete members.

5. An apparatus according to claim 1, wherein said rigid connection member includes a corrugated part.

6. An apparatus according to claim 1, also having liquid in at least one hollow portion of rigid connection member.

7. An apparatus according to claim 1, wherein said particulate material comprises both power and granules which are substantially larger than said powder.

8. An apparatus according to claim 7, wherein said particulate material includes particles of a plurality of sizes.

9. An apparatus according to claim 1, wherein said support member includes a hollow cylindrical bobbin.

10. An apparatus according to claim 9, wherein a cylindrical surface of said bobbin has thereon a plurality of hollow tubes, each of said tubes containing said particulate material, and at least one of said tubes forming said rigid connection member.

11. An apparatus according to claim 10, wherein said tubes extend axially of said bobbin.

12. An apparatus according to claim 10, wherein said tubes extend circumferentially relative to said bobbin.

13. A magnetic resonance imaging apparatus having:
    magnetic field generation means;
    a support member for supporting said magnetic field generation means in a predetermined position, said support member including a rigid connection attached to said generation means and including at least one shallow portion therein,; and
    particulate material disposed within at least one hollow portion of said support member so as to be movable within said hollow portion.

14. An apparatus according to claim 13, wherein said support member includes a cylindrical surface and said hollow portion of said support member extends over substantially the whole of said cylindrical surface.

15. An apparatus according to claim 13, wherein said hollow portion of said support member comprises a plurality of hollow tubes.

16. An apparatus as claimed in claim 1, wherein said rigid connection member includes a plurality of hollow portions, and said particulate material is disposed in at least two of said plurality of hollow portions, wherein during operation of said generation means, induced vibration is transmitted to said rigid connection member, causing said particulate material to move and collide with respect to one another and the hollow portion so as to dissipate vibrational energy and reduce noise.

17. An apparatus as claimed in claim 13, wherein said support member includes a plurality of hollow portions, and said particulate material is disposed in at least two of said plurality of hollow portions, wherein during operation of said generation means, induced vibration is transmitted to said support member, causing said particulate material to move and collide with respect to one another and the hollow portion so as to dissipate vibrational energy and reduce noise.

* * * * *